(12) United States Patent
Lewison

(10) Patent No.: US 7,965,120 B2
(45) Date of Patent: Jun. 21, 2011

(54) DIGITALLY CONTROLLED CML BUFFER

(75) Inventor: Richard Lewison, Raleigh, NC (US)

(73) Assignee: Qimonda AG, Munich (DE)

( * ) Notice: Subject to any disclaimer, the term of this patent is extended or adjusted under 35 U.S.C. 154(b) by 0 days.

(21) Appl. No.: 12/275,372

(22) Filed: Nov. 21, 2008

(65) Prior Publication Data

US 2010/0127746 A1    May 27, 2010

(51) Int. Cl.
*H03H 11/26* (2006.01)
(52) U.S. Cl. ........ 327/261; 327/266; 327/280; 327/287; 327/57
(58) Field of Classification Search ............. 327/57, 327/261, 266, 274, 276, 280, 281, 287
See application file for complete search history.

(56) References Cited

U.S. PATENT DOCUMENTS

| | | | | |
|---|---|---|---|---|
| 6,847,225 | B2 * | 1/2005 | Viehmann et al. | 326/30 |
| 7,298,195 | B2 * | 11/2007 | Freyman et al. | 327/247 |
| 7,514,991 | B2 * | 4/2009 | Schnarr | 327/563 |
| 2006/0114044 | A1 * | 6/2006 | Mintchev et al. | 327/261 |
| 2007/0230579 | A1 * | 10/2007 | Shen et al. | 375/240.16 |
| 2009/0264951 | A1 * | 10/2009 | Sharma | 607/40 |

* cited by examiner

*Primary Examiner* — Long Nguyen
(74) *Attorney, Agent, or Firm* — Dicke, Billig & Czaja, PLLC

(57) ABSTRACT

Techniques and corresponding circuits for achieving programmable delay of a current mode logic delay buffer are provided. The techniques provide for incremental delay with substantially equal increments. Delay may be achieved through the use of a circuit arrangement that allows biasing current to be controlled effect the response time of the circuit by digital control.

15 Claims, 6 Drawing Sheets

DIGITALLY CONTROLLED CML BUFFER

BACKGROUND OF THE INVENTION

Description of the Related Art

Current mode logic (CML) delay elements are often utilized in high speed computing systems, phase locked loops (PLLs) and delay locked loops (DLLs) to achieve a desired relationship between speed and high resolution. In order to obtain high speed, low swing performance conventional CML buffers consist of a single stage differential amplifier with a resistive load. The propagation delay through a conventional CML delay element is based solely on the amount of bias voltage supplied to the current source. The biasing voltage used to create the tail current by analog adjustment cannot be changed quickly since the voltage is usually generated by an on-chip analog reference which could have a large capacitive load which must be charged and discharged in order to change the level. This time is often too long to fulfill the speed requirements of current high speed systems. In addition, there is a limit to how low or high the bias voltage can be driven and still have the buffer switch properly and the delay not suffer from non-monotonic behavior. One improved approach is proposed in U.S. Pat. No. 7,403,057 to Cranford et al. This invention proposes a method of changing the propagation delay through a CML buffer while avoiding nonlinear behavior by using weighted tail currents and multiple switching point optimized inverters which have different switching points controlled by the buffers tuning voltage, which is an analog signal between 0.7V and 10.0V. The addition of this analog tuning voltage has the drawback of not being able to be switched quickly. As a result of introducing another analog tuning voltage, achieving a desired performance is difficult.

SUMMARY OF THE INVENTION

Embodiments of the invention generally provide circuits and methods of creating a delay of a current mode logic delay buffer including a differential stage, a biasing circuit arranged to provide a tail current for the differential stage, a switching arrangement connected in series with the biasing circuit and a logic device configured to selectively control the switching arrangement to vary the tail current to control the response time of the current mode logic delay buffer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention generally provide techniques for achieving accurate digital control of programmable CML delays. The programmable delay may be controlled to provide uniform or non-uniform resolution. For example, the techniques may provide for incremental delay with substantially equal increments. For some embodiments, linear resolution may be achieved by controlling the biasing current ratio between two stages. The techniques described herein may be utilized in a wide variety of applications that benefit from programmable delay. As an example, memory devices, such as dynamic random access memory (DRAM) devices, often utilize programmable delay elements in delay locked loops (DLLs) and/or phase locked loops (PLLs) used to achieve a desired relationship between externally supplied control signals (e.g., clock or data strobe signals) and corresponding internally generated control signals used to access (read/write) storage elements of the memory device. However, those skilled in the art will recognize a variety of other applications in which the techniques provided herein may be utilized, such as central processor units (CPUs), graphics processor units (GPUs), digital signal processors (DSPs), and the like.

Figure 1:
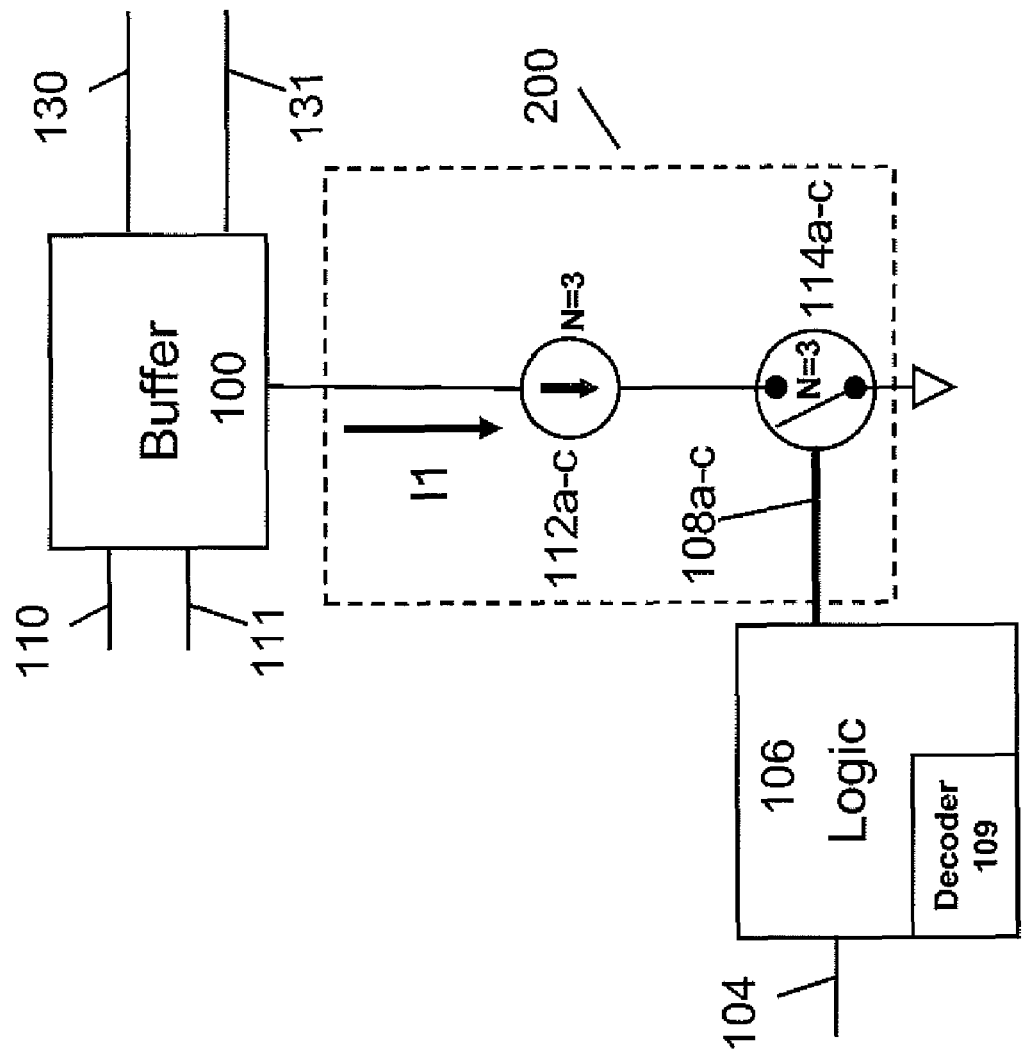
FIG. 1 illustrates a current mode logic buffer with a digitally controlled propagation delay according to an embodiment of the present invention.

Referring now to FIG. 1, a block diagram of a preferred embodiment of an electronic circuit configured as a digitally controlled programmable delay buffer is shown. The electronic circuit includes a current mode logic (CML) differential stage 100 which is biased with a tail current I1 by a multitude of current sources 112*a-c*. The amount of propagation delay through the buffer is determined by the amount of bias current supplied to differential stage 100.

Embodiments of the present invention provide digital control of the biasing currents. This allows the biasing current buffer to quickly be switched, as shown in block 200. Block 200, of FIG. 1, includes three current sources 112*a*, 112*b* and 112*c* connected in series with digital switches 114*a*, 114*b* and 114*c*. Control signals 108*a-c*, which are supplied by logic block 106 selectively control digital switches 114*a-c*, such that when any of digital switches 108*a-c* are closed current is allowed to flow and when any of digital switches 108*a-c* are open current is not allowed to flow. Using the digital switches allows for faster switching of the tail current, thereby allowing the propagation delay of the CML buffer to be changed quickly.

Figure 2:
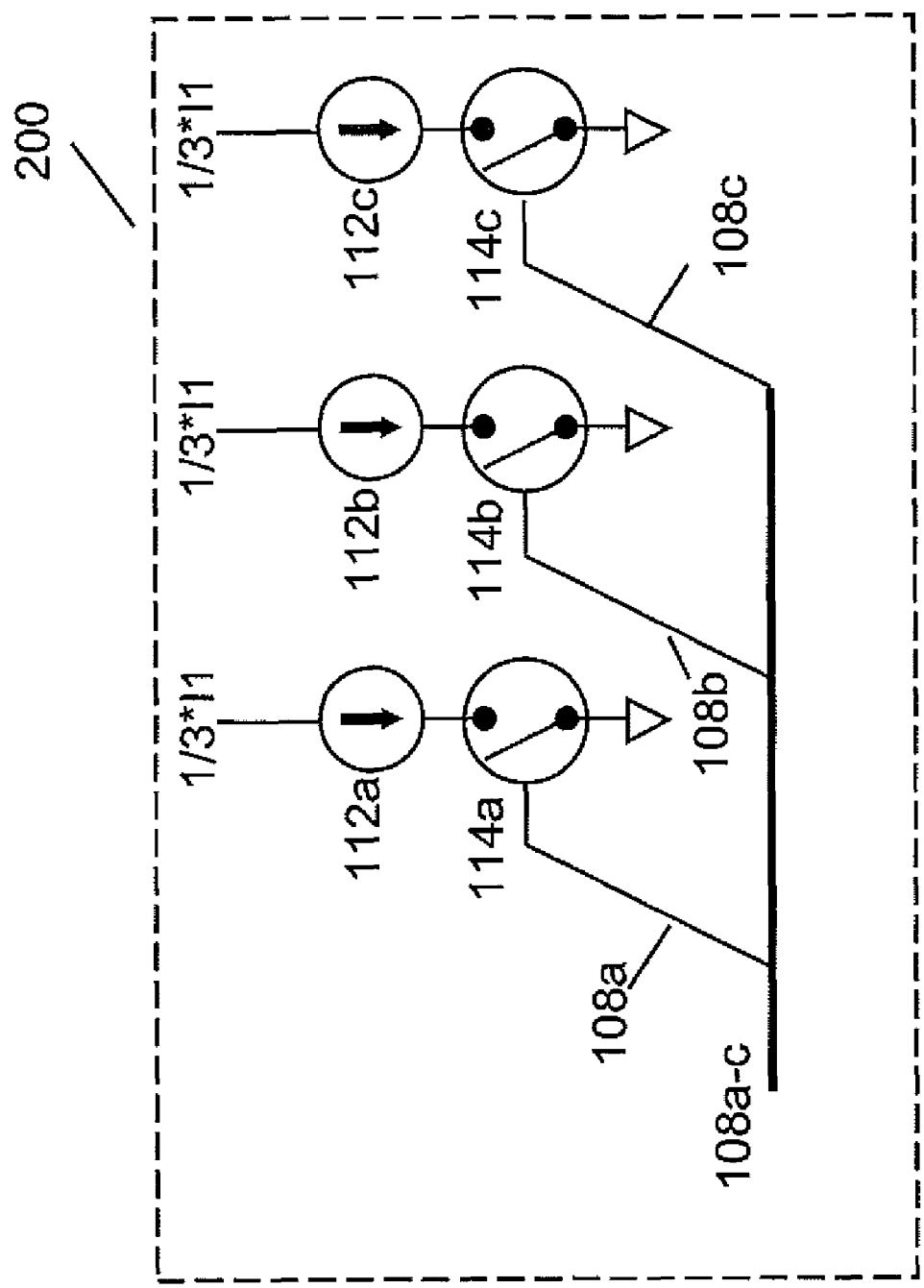
FIG. 2 illustrates a digitally selectable current source according to an embodiment of the present invention.

A more detailed view of current sources 112*a-c* and digital switches 114*a-c* is shown in FIG. 2. Control signal 108*a* determines whether or not digital switch 114*a* is open or closed, so that current flowing through current source 112*a* is blocked or allowed respectively.

Referring back to FIG. 1, control signals 108*a-c* are generated by logic block 106, which can include decoder 109. In one embodiment, logic block 106 accepts a digital input code 104 and then decodes the digital input, using decoder 109, such that the resulting output control signals 108*a-c* are greater in number than the digital input code. Based on the digital input code 104, the control signals 108*a-c* determine which switches 114*a-c* are closed, thus changing the amount of current supplied by current sources 112*a-c* and thereby determining how much tail current is supplied to the CML buffer 100. The propagation delay from the input signals INP 110 and INN 111 through the CML buffer to the outputs OUT 130 and OUTN 131 is then constant until a different digital input code 104 is supplied to logic block 106.

Digital input code 104, can be provided to logic block 106 by any number of ways. Some examples of apparatus used to supply the digital input code 104 to logic block 106 are programmable memories, laser fuses, electrical fuses, electrical anti-fuses, registers, internal control logic from a delay locked loop (DLL) or phase locked loop (PLL) and even external control through an input pin of the packaged device in which this CML buffer is placed.

Figure 3:
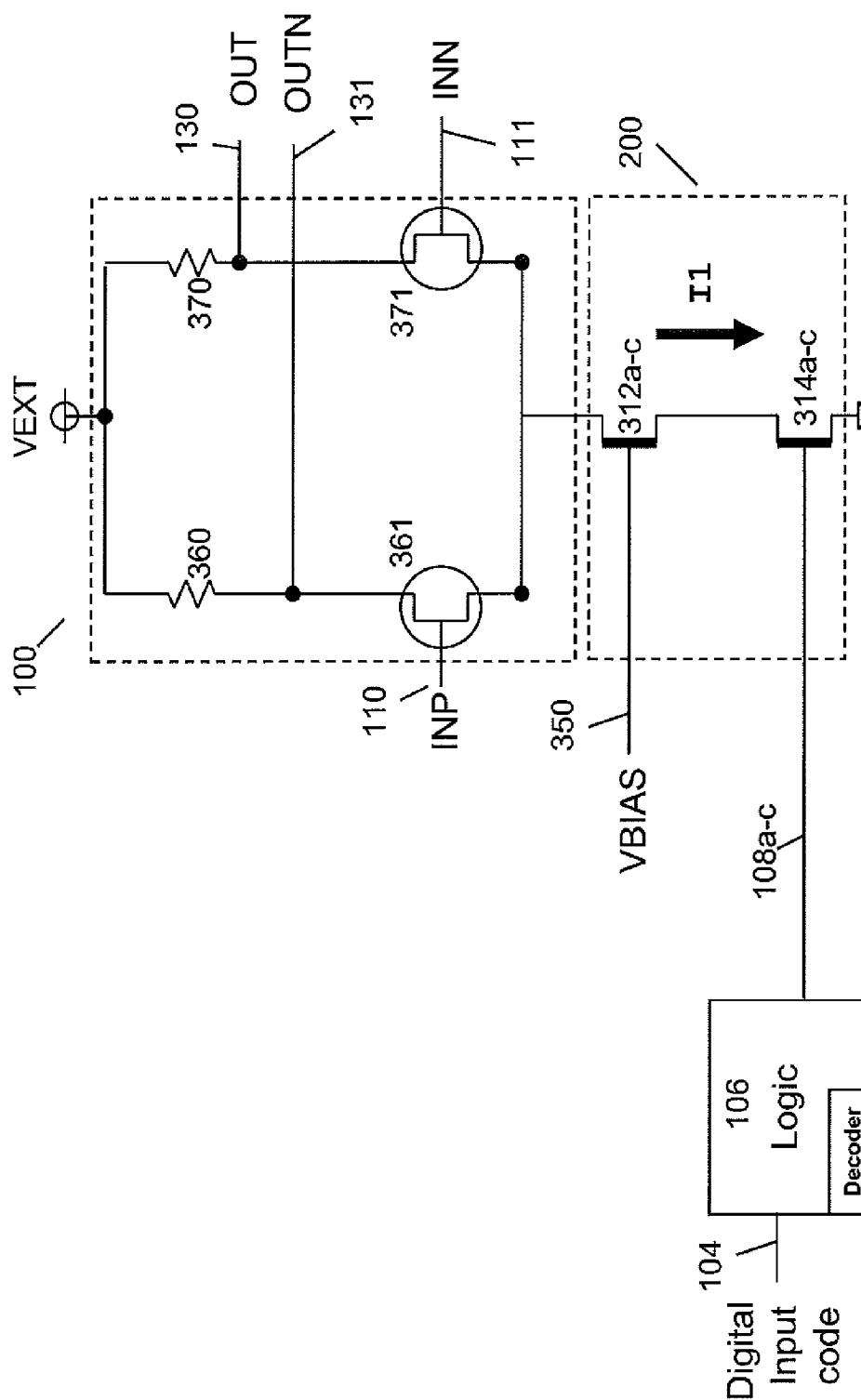
FIG. 3 illustrates a circuit diagram of the embodiment of FIG. 1.

A circuit diagram of the electronic circuit discussed above is shown in FIG. 3. Current mode logic (CML) differential stage 100 includes a differential pair of NMOS transistor 361 and 371 with resistive load devices 360 and 370. Resistive load devices 360 and 370 could be actual resistors or transistors biased in the linear region as known by those skilled in the art. INP 110 and INN 111 are complementary input signals to the differential pair. The tail current biasing in this embodiment includes current source devices 312a-c electrically connected in series with digital control switches 314a-c. A constant bias voltage (VBIAS) 350 determines the amount of current supplied by each current source device. As discussed while describing FIG. 1, control signals 108a-c determine how many digital control switches are opened or closed. Fast switching of the amount of tail biasing current, and thus fast switching of the propagation delay through the electronic circuit, is achieved by the control of the digital control switches.

While the aforementioned embodiment contains only three digitally controlled current sources, it should be understood that embodiments of the present invention are not limited to this example and could contain any number of digitally controlled current sources as will be seen in other preferred embodiments.

Figure 4:
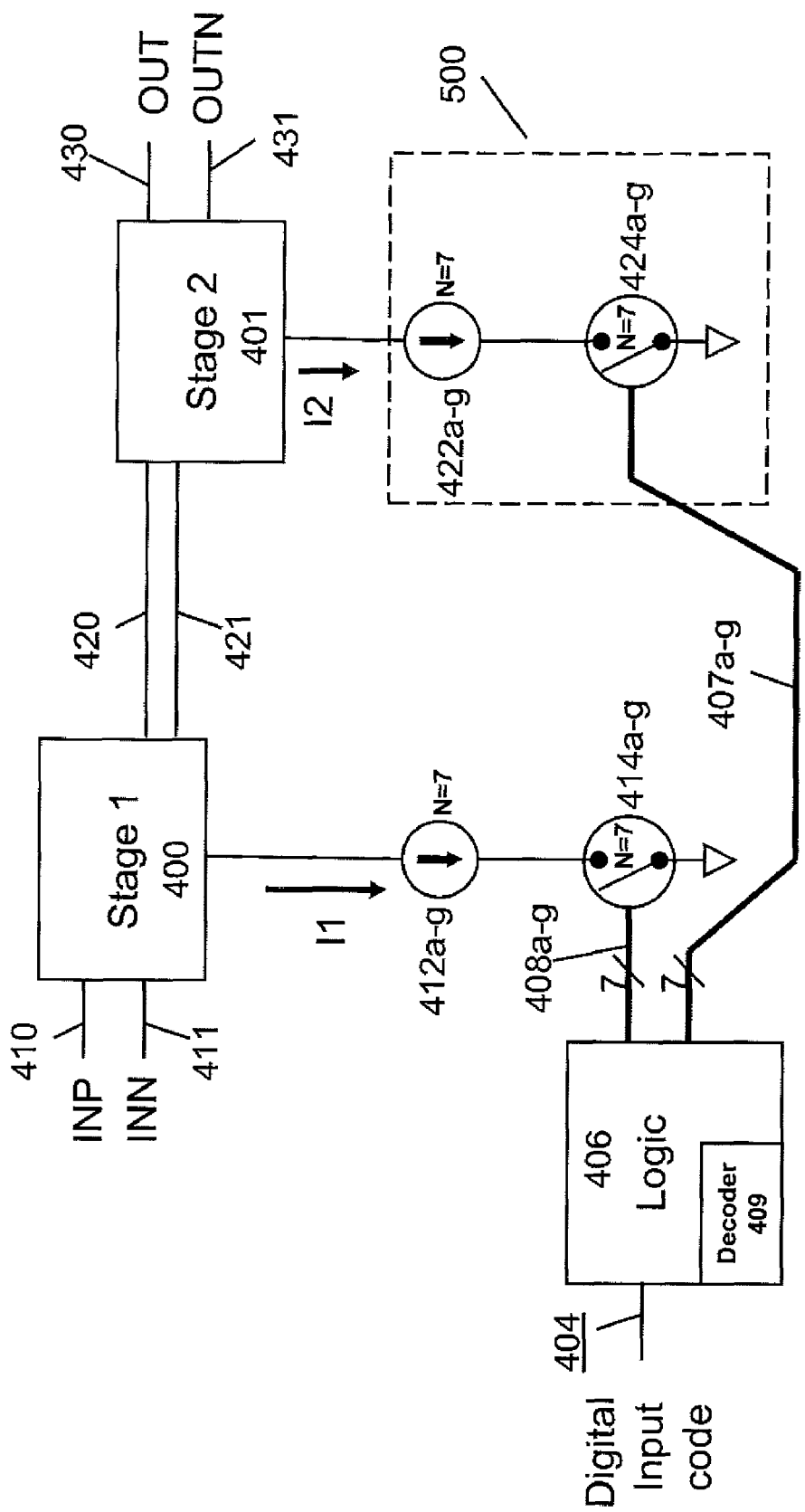
FIG. 4 illustrates a multi-stage embodiment of the present invention.

FIG. 4 shows another preferred embodiment of the present invention, which has the added feature of less non-linear behavior when switching between delay settings. The block diagram shows the electronic circuit configured as a digitally controlled programmable delay buffer. The digitally controlled programmable delay buffer includes a first stage 400 and a second stage 401, which have biasing tail currents I1 and I2 respectively. The first stage 400 is typically a differential stage with a resistive load, but could be something different, such as a folded cascade stage. The second stage 401 is configured such that it acts as a negative resistance. The embodiment is constructed such that when the second stage biasing tail current I2 is increased, the first stage biasing tail current I1 will be decreased by the same amount. In this way the summation of first biasing tail current I1 and second biasing tail current I2 used by the electronic circuit remains constant, but the ratio of the first biasing tail current I1 and second biasing tail current I2 is changed.

Both the first stage biasing current I1 and the second stage biasing current I2 are controlled in the same way as described above. However, in this embodiment both the number of first stage current sources 412a-g and second stage current sources 422a-g is increased to seven, enabling the propagation delay through the electronic circuit to be divided into seven discrete steps.

The digital control of the biasing currents allows the biasing current to quickly be switched, as shown in block 500 for example. Block 500, of FIG. 4, includes seven current sources 412a-g connected in series with seven digital switches 408a-g, which combine to generate the first stage biasing tail current I1. Similarly, seven current sources 422a-g connected in series with seven digital switches 424a-g, combine to generate the second stage biasing tail current I2. Control signals 407a-g, which are output from logic block 406 selectively control digital switches 424a-g, such that when any of digital switches 424a-g are closed current is allowed to flow and when any of digital switches 424a-g are open current is not allowed to flow. Using the digital switches allows for faster switching of the tail current, thereby allowing the propagation delay of the CML buffer to be changed quickly.

Figure 5:
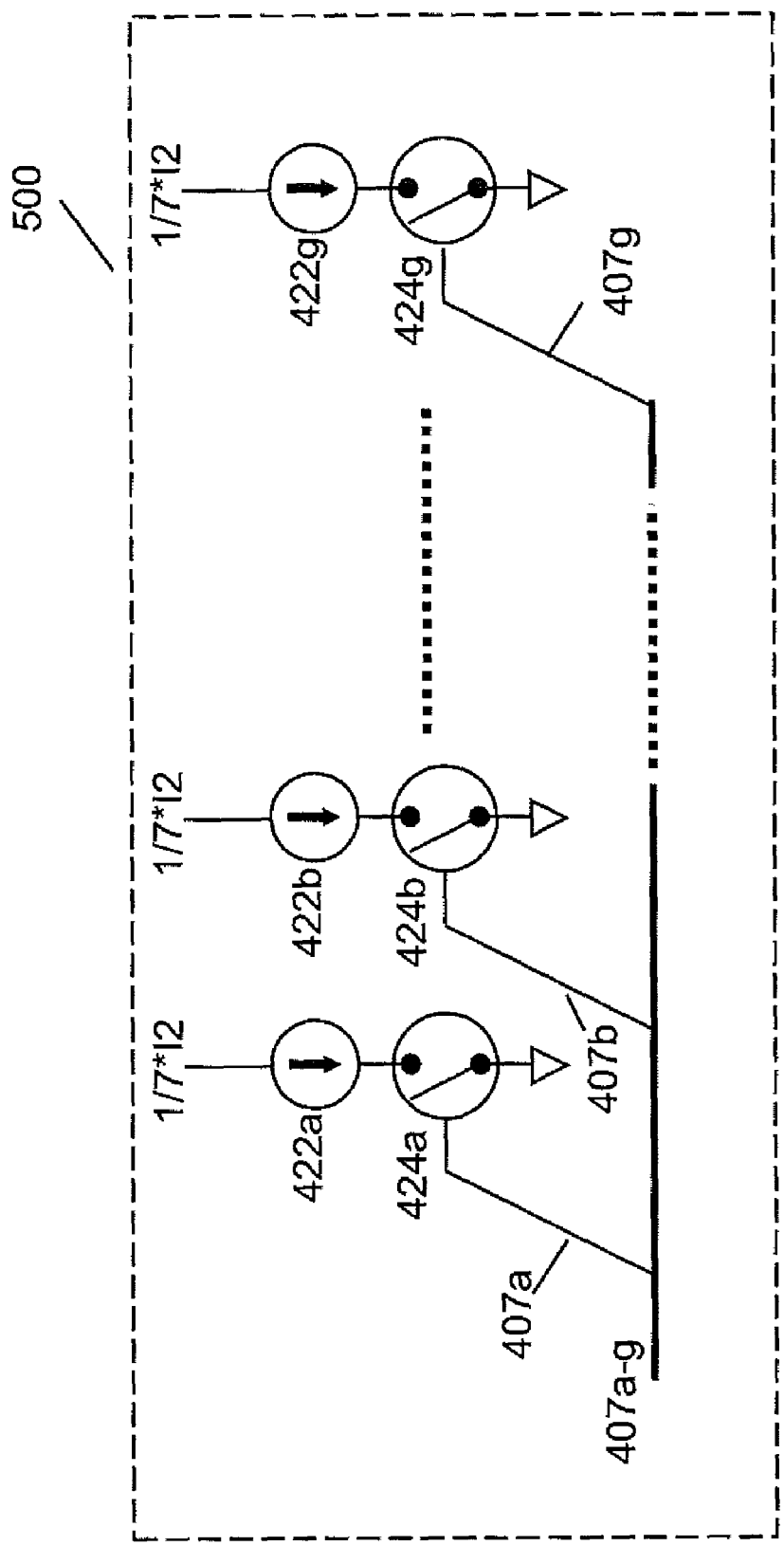
FIG. 5 illustrates a further digitally selectable current source according to an embodiment of the present invention.

A more detailed view of the second stage biasing tail current sources 422a-g and digital switches 424a-g is shown in FIG. 5. Control signal 407a determines whether or not digital switch 424a is open or closed, so that current flowing through current source 422a is blocked or allowed respectively.

Referring back to FIG. 4, first stage control signals 408a-g and second stage control signals 407a-g are generated using logic block 406, which can include decoder 409. In one embodiment, logic block 406 accepts a digital input code 404 and then decodes the digital input, using decoder 409, such that both the resulting first stage control signals 408a-g and second stage control signals 407a-g are greater in number than the digital input code 404. Based on the digital input code 404, the first stage control signals 408a-g determine which digital switches 414a-g are closed, thus changing the amount of current supplied by current sources 412a-g and thereby determining how much first stage biasing tail current I1 is supplied to the first stage 100. The second stage 401 biasing tail current I2 is generated in a similar fashion. Using the digital input code 404, the second stage control signals 407a-g determine which digital switches 424a-g are closed, thus changing the amount of current supplied by current sources 422a-g and thereby determining how much second stage biasing tail current I2 is supplied to the second stage 401.

Again, the digital input code 404, can be provided to logic block 406 by any number of ways. Some examples of apparatus used to supply the digital input code 404 to logic block 406 are programmable memories, laser fuses, electrical fuses, electrical anti-fuses, registers, internal control logic from a delay locked loop (DLL) or phase locked loop (PLL) and even external control through an input pin of the packaged device in which this CML buffer is placed.

The propagation delay from the input signals INP 410 and INN 411 through the electronic circuit to the outputs OUT 430 and OUTN 431 is based on the ratio of first stage biasing tail current I1 to second stage biasing tail current I2. In the preferred embodiments, the summation of the first stage biasing tail current I1 and the second stage biasing tail current I2 remains constant even while the ratio is changing.

Figure 6:
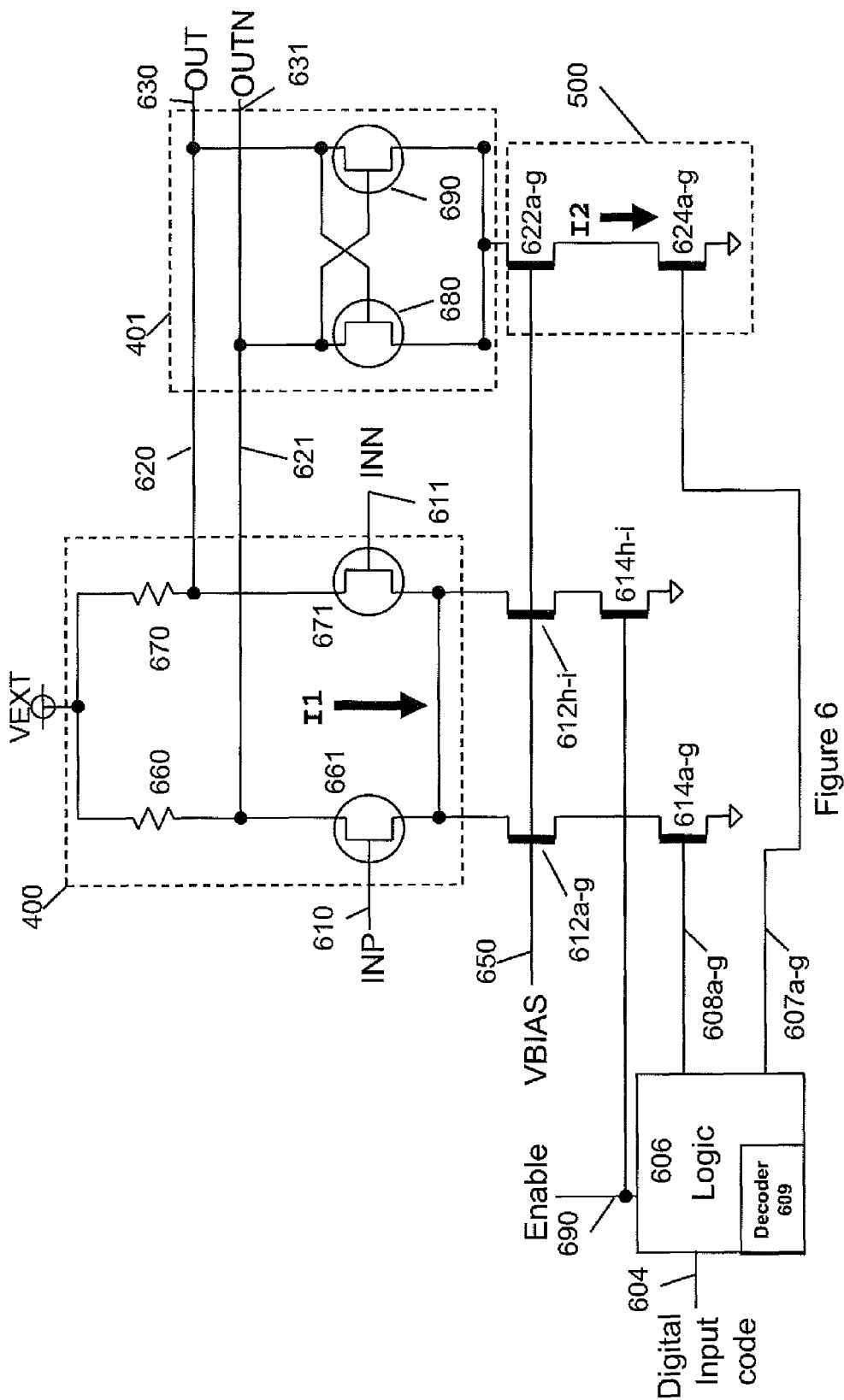
FIG. 6 illustrates a circuit diagram of the multi-stage programmable delay element of FIG. 4.

A circuit diagram of the preferred embodiment discussed in FIG. 4 is shown in FIG. 6. The electronic circuit is configured as a digitally controlled programmable delay buffer. The first stage 400 is a current mode logic (CML) differential stage, including input transistors 661 and 671, with a resistive load having load devices 660 and 670. Resistive load devices 660 and 670 could be linear resistors or transistors biased in the linear region as known by those skilled in the art. INP 610 and INN 611 are complementary input signals to the differential pair. The first stage biasing tail current I1 in this embodiment includes first stage current source devices 612a-g electrically connected in series with first stage digital control switches 614a-g. A constant bias voltage (VBIAS) 650 determines the amount of current supplied by each current source device. A minimum first stage biasing tail current I1 is maintained by first stage current source devices 612h-i connected in series with enable devices 614h-i, which is controlled by enable signal 690. Enable signal 690 is active whenever the digitally controlled programmable delay buffer is needed. As discussed while describing FIG. 4, first stage control signals 608a-g determine how many first stage digital control switches 614a-g are opened or closed.

The second stage 401 is shown in FIG. 6 as including devices 680 and 690 configured as a cross-coupled differential stage with the electrical characteristic of having a negative resistance as is known to those skilled in the art. The first stage and second stage are coupled together by differential signals 620 and 621. The second stage biasing tail current I2 in this embodiment includes second stage current source devices 622a-g electrically connected in series with first stage digital control switches 624a-g. A constant bias voltage (VBIAS) 650 determines the amount of current supplied by each current source device. As discussed while describing FIG. 4, second stage control signals 607a-g determine how many second stage digital control switches 624a-g are opened or closed.

The first stage control signals 608a-g and second stage control signals 607a-g are generated using logic block 606, which could include decoder 609. In one embodiment, logic block 606 accepts a digital input code 604 and then decodes the digital input, using decoder 609, such that both the resulting first stage control signals 608a-g and second stage control signals 607a-g are greater in number than the digital input code 604. Based on the digital input code 604, the first stage control signals 608a-g determine which digital switches 614a-g are closed, thus changing the amount of current supplied by current sources 612a-g and thereby determining how much first stage biasing tail current I1 is supplied to the first stage 400. The second stage 401 biasing tail current I2 is generated in a similar fashion. Using the digital input code 604, the second stage output control signals 607a-g determine which digital switches 624a-g are closed, thus changing the amount of current supplied by current sources 622a-g and thereby determining how much second stage biasing tail current I2 is supplied to the second stage 401.

The propagation delay from the input signals INP 610 and INN 611 through the electronic circuit to the outputs OUT 630 and OUTN 631 is based on the ratio of first stage biasing tail current I1 to second stage biasing tail current I2. In the preferred embodiment shown in FIG. 6, the summation of the first stage biasing tail current I1 and the second stage biasing tail current I2 remains constant even while the ratio is changing. This is illustrated in Table 1, which shows an example of how changing digital input code 604 is decoded into the first and second stage control signals 608a-g and 607a-g respectively. A relative first and second biasing tail current relationship is also shown, such that the summation of the first and second stage biasing tail current remains constant, but the ratio is changed.

Table 1 shows an example of what the decoding of the digital input code could be for a digitally programmable delay buffer shown in FIG. 4 and FIG. 6. As can be seen in the table the ratio of first stage biasing tail current to second stage biasing tail current is changing as the digital input code is incremented from 000 to 111. However, the summation of the first stage biasing tail current and second stage biasing tail current remains equal to a constant (9x).

TABLE 1

Example ecoding of digital input code

| Digital Input code [0:2] | First stage control signals [0:6] | Second stage control signals [0:6] | First stage biasing tail current I1 | Second stage biasing tail current I2 |
|---|---|---|---|---|
| 000 | 1111111 | 0000000 | 9x | 0x (min delay) |
| 001 | 1111110 | 0000001 | 8x | 1x |
| 010 | 1111100 | 0000011 | 7x | 2x |
| 011 | 1111000 | 0000111 | 6x | 3x |
| 100 | 1110000 | 0001111 | 5x | 4x |
| 101 | 1100000 | 0011111 | 4x | 5x |
| 110 | 1000000 | 0111111 | 3x | 6x |
| 111 | 0000000 | 1111111 | 2x | 7x (max delay) |

Fast switching of the amount of tail biasing current, and thus fast switching of the propagation delay through the electronic circuit, is achieved by the control of the digital control switches While the foregoing is directed to embodiments of the present invention, other and further embodiments of the invention may be devised without departing from the basic scope thereof, and the scope thereof is determined by the claims that follow.

What is claimed is:

1. An electronic circuit comprising:
    a current mode logic (CML) delay buffer having a first differential stage and a second differential stage, the CML delay buffer configured to receive a first input signal and a second input signal complementary to the first input signal, the CML delay buffer configured to provide complementary output signals based only on the first and second input signals and a propagation delay through the CML delay buffer;
    a first biasing circuit arranged to provide a first tail current for the first differential stage;
    a second biasing circuit arranged to provide a second tail current for the second differential stage; and
    a logic device configured to selectively control the first and second biasing circuits to adjust the ratio of the first tail current and the second tail current, to vary the propagation delay through the CML delay buffer.

2. The electronic circuit of claim 1, wherein the first and second biasing circuits comprise a first and second plurality of biasing transistors.

3. The electronic circuit of claim 2, wherein the first and second plurality of biasing transistors have substantially equal width to length aspect ratios.

4. The electronic circuit of claim 1, wherein the summation of the first tail current and the second tail current is constant.

5. The electronic circuit of claim 1, wherein the logic device is provided with a digital input code via a programmable memory.

6. The electronic circuit of claim 5, further comprising a decoder for transforming the digital input code into a set of control signals greater in number than the digital input code.

7. A programmable delay circuit comprising:
    a current mode logic (CML) delay cell configured to receive a first input signal and a second input signal complementary to the first input signal, the CML delay cell configured to provide complementary output signals based only on the first and second input signals and a propagation delay through the CML delay cell, the CML delay cell comprising:

a first differential stage comprising a resistive load, the first differential stage having a first biasing tail current; and a second differential stage, which is cross-coupled, the second differential stage having a second biasing tail current and configured to act as a negative resistance;

a plurality of first biasing transistors used to generate the first biasing tail current;

a plurality of second biasing transistors used to generate the second biasing tail current;

a first and second plurality of control transistors connected in series with the first and second plurality of biasing transistors such that when the first and second plurality of control transistors are nonconductive no current flows through the first and second biasing transistors; and a logic device configured, based on a digital code, to selectively determine which of the first or second plurality of control transistors is conductive, to vary the propagation delay through the CML delay cell based on the ratio of the first tail current to the second tail current.

8. The programmable delay circuit of claim 7, wherein the plurality of biasing transistors having substantially equal width to length aspect ratios.

9. The programmable delay circuit of claim 7, wherein the summation of the first tail current and the second tail current is constant.

10. The programmable delay circuit of claim 7, wherein the logic device is provided with a digital code via a programmable memory.

11. The programmable delay circuit of claim 10, further comprising a decoder for transforming the digital input code into a set of control signals greater in number than the digital input code.

12. A method, comprising:
receiving an input signal;
generating an output signal that is a delayed version of the input signal based only on a ratio of two biasing currents and the input signal; and
varying a delay between the input signal and the output signal by varying the ratio of the two biasing currents based on a digital code.

13. The method of claim 12, wherein varying a delay between the input signal and the output signal by varying the ratio of the two biasing currents comprises selectively switching a plurality of bias transistors based on a control code.

14. The method of claim 13, further comprising generating the control code based on a set of control signals having fewer bits than the control code.

15. An electronic circuit comprising:
a current mode logic (CML) differential delay stage, the differential delay stage configured to receive a first input signal and a second input signal complementary to the first input signal, the differential delay stage configured to provide complementary output signals based only on the first and second input signals and a delay through the differential delay stage;

a plurality of biasing transistors arranged to provide a variable tail current;

a plurality of control transistors connected in series with the plurality of biasing transistors such that when the control transistors are conductive current flows through the plurality of biasing transistors; and a logic device configured to vary the delay through the differential delay stage by selectively determining which of the plurality of control transistors is conductive based on a digital code.

* * * * *